(12) United States Patent
Kim (10) Patent No.: US 8,048,597 B2
(45) Date of Patent: Nov. 1, 2011

(54) SEMICONDUCTOR DEVICE WITH A BULB-TYPE RECESS GATE

(75) Inventor: Dae Young Kim, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/891,679

(22) Filed: Sep. 27, 2010

(65) Prior Publication Data

US 2011/0014553 A1    Jan. 20, 2011

Related U.S. Application Data

(62) Division of application No. 11/647,328, filed on Dec. 29, 2006, now Pat. No. 7,803,681.

(30) Foreign Application Priority Data

Sep. 8, 2006  (KR) .................. 10-2006-0086871

(51) Int. Cl.
    *G03F 1/00*    (2006.01)
(52) U.S. Cl. .......................................... 430/5
(58) Field of Classification Search ............. 430/5, 311, 430/312, 313, 394; 438/259
    See application file for complete search history.

(56) References Cited

U.S. PATENT DOCUMENTS

| 6,930,754 | B1 | 8/2005 | Sugita et al. |
| 2004/0195608 | A1 | 10/2004 | Kim et al. |
| 2005/0173759 | A1 | 8/2005 | Kim et al. |
| 2006/0099522 | A1 | 5/2006 | Park et al. |
| 2006/0183030 | A1* | 8/2006 | Nakao .............................. 430/5 |

FOREIGN PATENT DOCUMENTS

| KR | 1020050034879 A | 4/2005 |
| KR | 1020050038425 A | 4/2005 |

* cited by examiner

*Primary Examiner* — Stephen Rosasco
(74) *Attorney, Agent, or Firm* — Kilpatrick Townsend & Stockton LLP (57) ABSTRACT

An exposure mask includes a plurality of active region patterns, and a plurality of recess patterns with a first line width, passing across the active region patterns, wherein the line width of at least one of the plurality of recess patterns neighboring one of the plurality of active region patterns is narrowed down into a second line width.

10 Claims, 8 Drawing Sheets

SEMICONDUCTOR DEVICE WITH A BULB-TYPE RECESS GATE

CROSS-REFERENCES TO RELATED APPLICATIONS

The present application is a divisional of U.S. patent application Ser. No. 11/647,328, filed on Dec. 29, 2006, which claims priority to Korean patent application number 10-2006-0086871, filed on Sep. 8, 2006, both of which are incorporated by reference in their entirety.

BACKGROUND OF THE INVENTION

The present invention generally relates to an exposure mask and a method of its use for manufacturing a semiconductor device. More specifically, the present invention concerns forming a recess of a bulb-type recess gate which is separated at a given distance from an edge of an active region in a device isolation region.

As a result of the high integration of semiconductor devices, as a line-width of a gate becomes narrower to shorten a channel length, electric characteristics of semiconductor devices are degraded. In order to prevent the degradation, a recess gate has been used. The recess gate increases a gate channel length by etching a semiconductor substrate of a local gate region at a given depth to increase a contact area between an active region and a gate.

However, semiconductor devices become smaller so that the recess and the gate occurs are misaligned. When the misalignment between the recess and the gate occurs, leakage current is generated. As a result, the line-width of the recess where the recess contacts with the gate is formed to be narrow in consideration of arrangement margin. In order to secure the effective area, the lower portion of the recess is formed to have a bulb-type.

BRIEF SUMMARY OF THE INVENTION

Various embodiments of the present invention are directed at providing an exposure mask and a method for manufacturing a semiconductor device using the same. The method includes forming a recess of a bulb-type recess gate which is separated at a given distance from an edge of an active region in a device isolation region.

According to an embodiment of the present invention, an exposure mask comprising a plurality of active region patterns; and a plurality of recess patterns with a first line width, passing across the active region patterns, wherein the line width of the recess pattern is neighboring the active region pattern narrowed down into a second line width.

According to an embodiment of the present invention, a method for manufacturing a semiconductor device, comprising the steps of: forming a photoresist film over a semiconductor substrate including a device isolation region and an active region; performing a lithography process using such an exposure mask to form a photoresist pattern; and patterning the semiconductor substrate using the photoresist pattern as a mask to form a recess on the isolation region and the active region.

DETAILED DESCRIPTION OF THE SPECIFIC EMBODIMENT

The present invention will be described in detail with reference to the accompanying drawings.

Figure 1A:
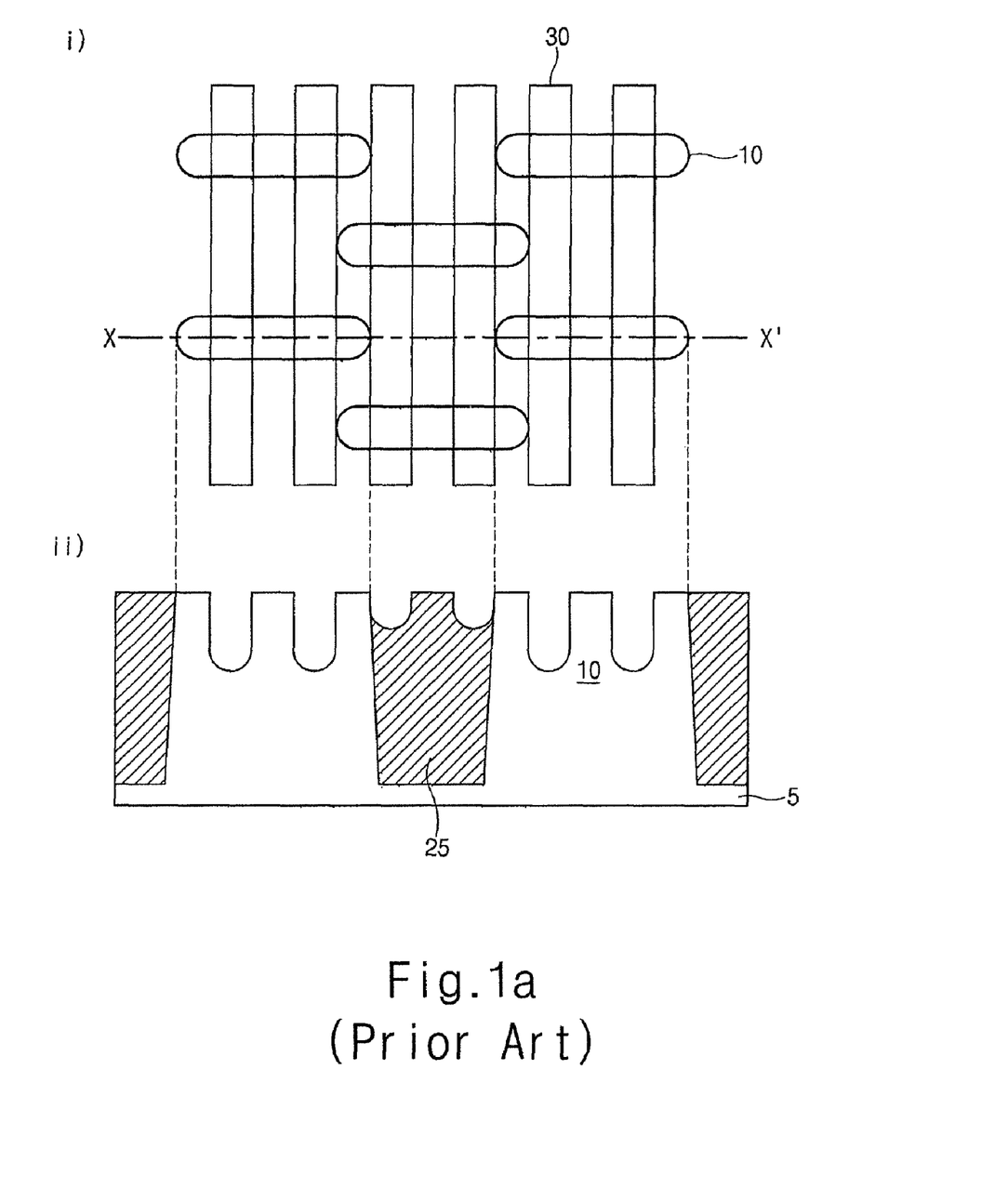
FIGS. 1a and 1b are diagrams illustrating a conventional method for forming a bulb-type recess gate of a semiconductor device.
Figure 1B:
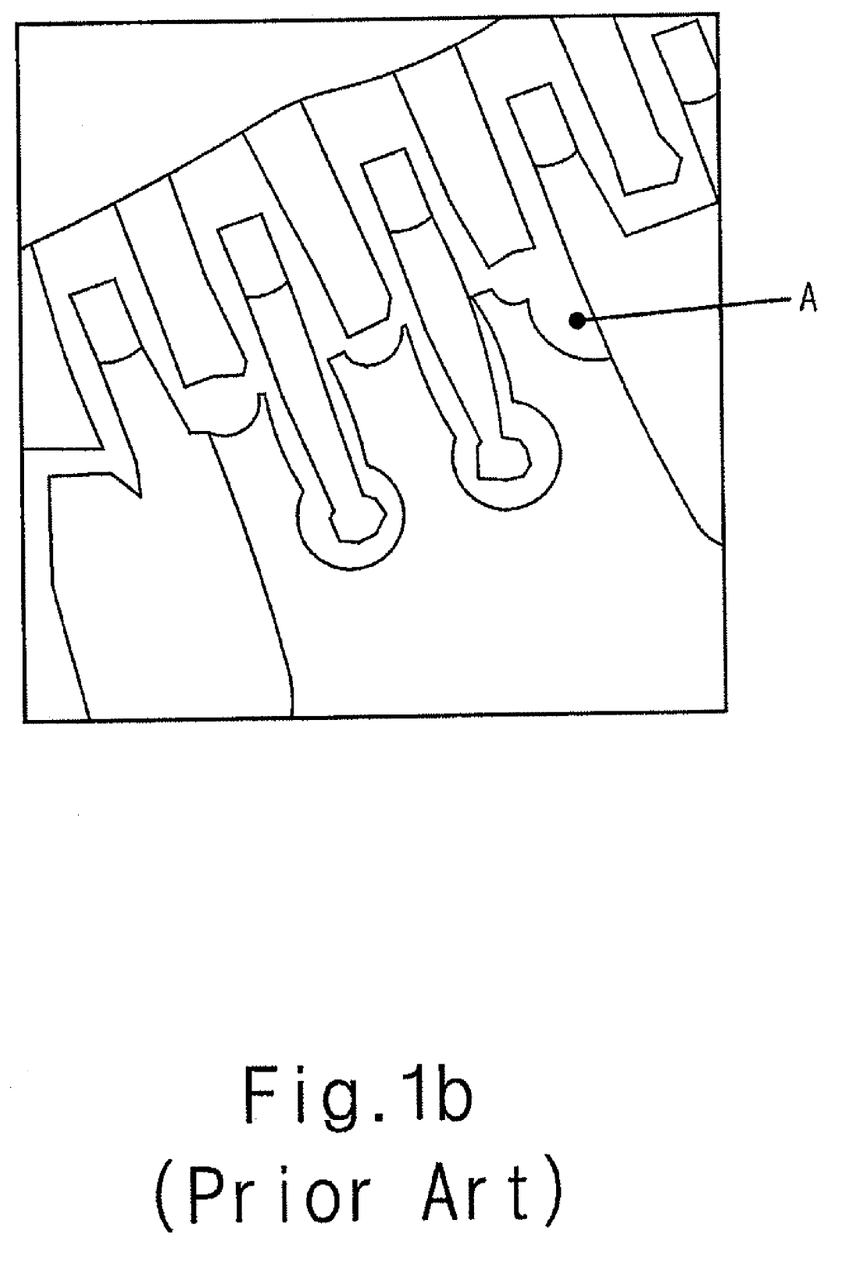

FIGS. 1a and 1b are diagrams illustrating a conventional method for forming a bulb-type recess gate of a semiconductor device.

(i) of FIG. 1a is a plane diagram, and (ii) of FIG. 1a is a cross-sectional diagram taken along X-X'. A device isolation region 25 that defines an active region 10 is formed over a semiconductor substrate 5. A line-type recess pattern 30 is located perpendicular to the active region 10.

FIG. 1a shows a process for forming a bulb-type recess gate. A device isolation trench (not shown) that defines the active region 10 is formed, and a sidewall oxide film (not shown) is formed in the trench (not shown). A liner nitride film (not shown) having a given thickness is formed over the resulting structure including the trench (not shown).

After a device isolation oxide film is formed to fill the trench (not shown), the oxide film is planarized to form a device isolation region 25.

After the device isolation region is formed, the active region of the semiconductor substrate and the device isolation region are etched to form a bulb-type recess. Here, a recess which is a neck portion of the bulb-type recess is first formed, and the recess is further etched by an isotropic etching process to obtain a bulb-type recess.

A gate polysilicon layer, a gate metal layer and a gate hard mask layer are formed over the resulting structure, and patterned to form a gate pattern. A spacer is formed at the gate pattern sidewall.

The polysilicon layer is filled between the gates to obtain a landing plug contact (LPC).

FIG. 1b is a photograph illustrating the bulb-type recess gate. When a recess which is a neck portion of the bulb-type recess is formed, the semiconductor substrate of the edge of the active region is partially etched as shown in 'A'. When the bulb-type recess is formed, the partially etched semiconductor substrate is further etched to damage the semiconductor substrate of the active region.

Also, the landing plug contact contacts with the damaged substrate to cause a defect during a Self Alignment Contact (SAC) process.

In the above-described exposure mask and method of its use for manufacturing a semiconductor device, an interface between the active region and the device isolation region is damaged when a recess of a passing gate formed over the device isolation region adjacent to the edge of the active region. Moreover, the semiconductor substrate of the edge of the active region is damaged by a chemical dry etch (CDE) process which is a process for forming a bulb-type recess so as to cause a bridge with the landing plug contact. As a result, electric characteristics of devices are degraded to reduce the margin and reliability of semiconductor devices.

Figure 2A:
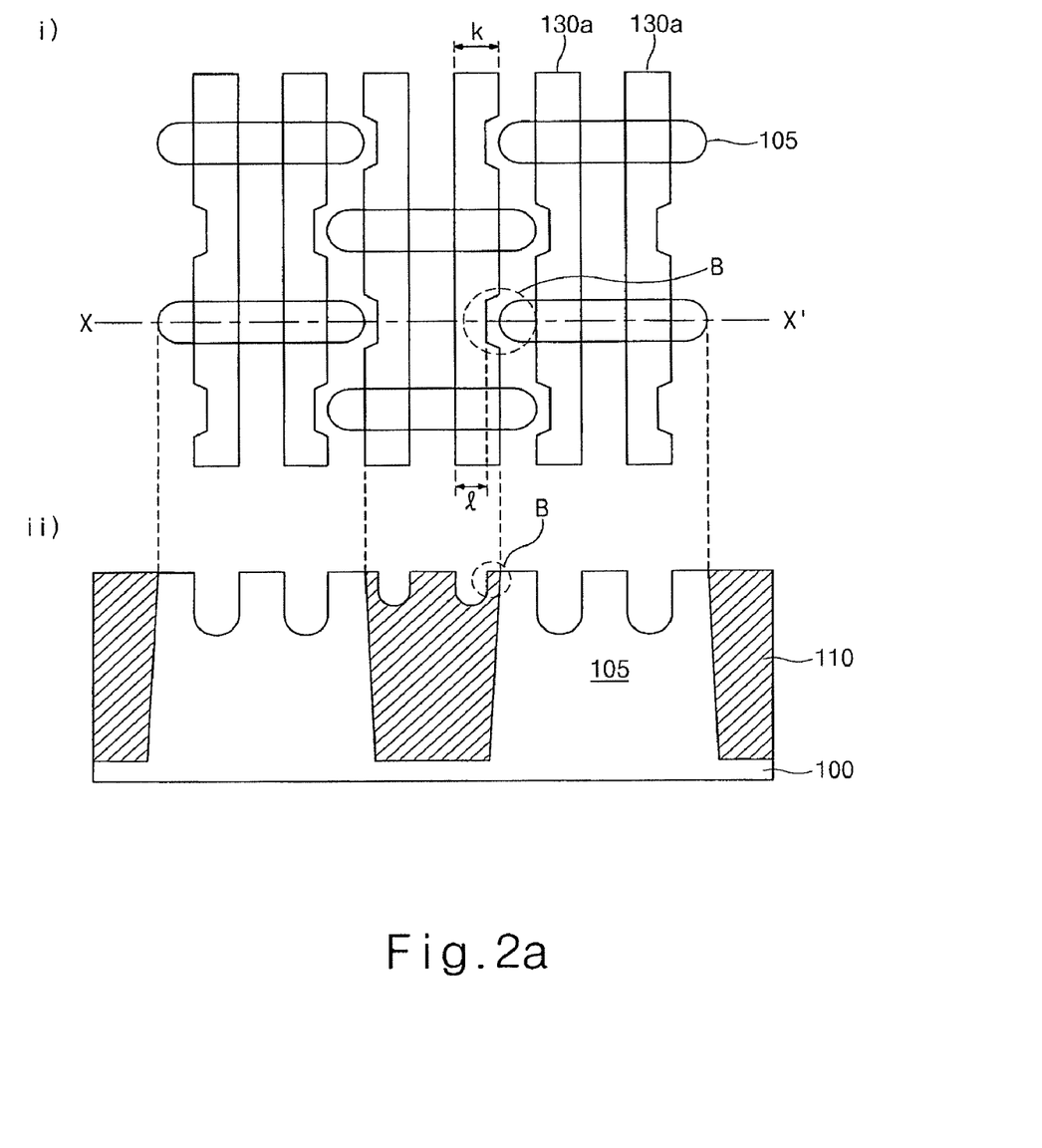
FIGS. 2a through 2c are diagrams illustrating an exposure mask and a method for manufacturing a semiconductor using the same according to an embodiment of the present invention.
Figure 2B:
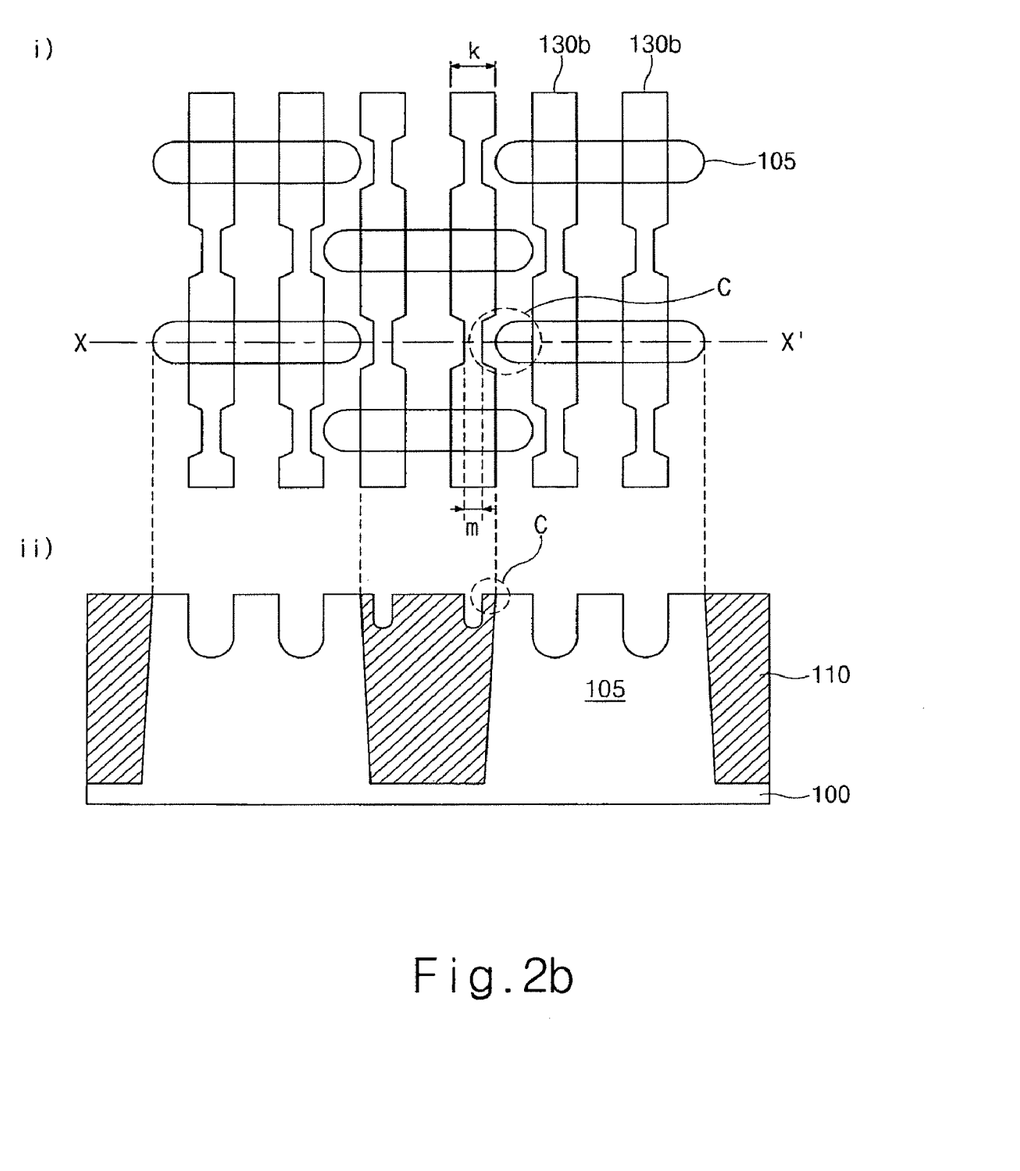
Figure 2C:
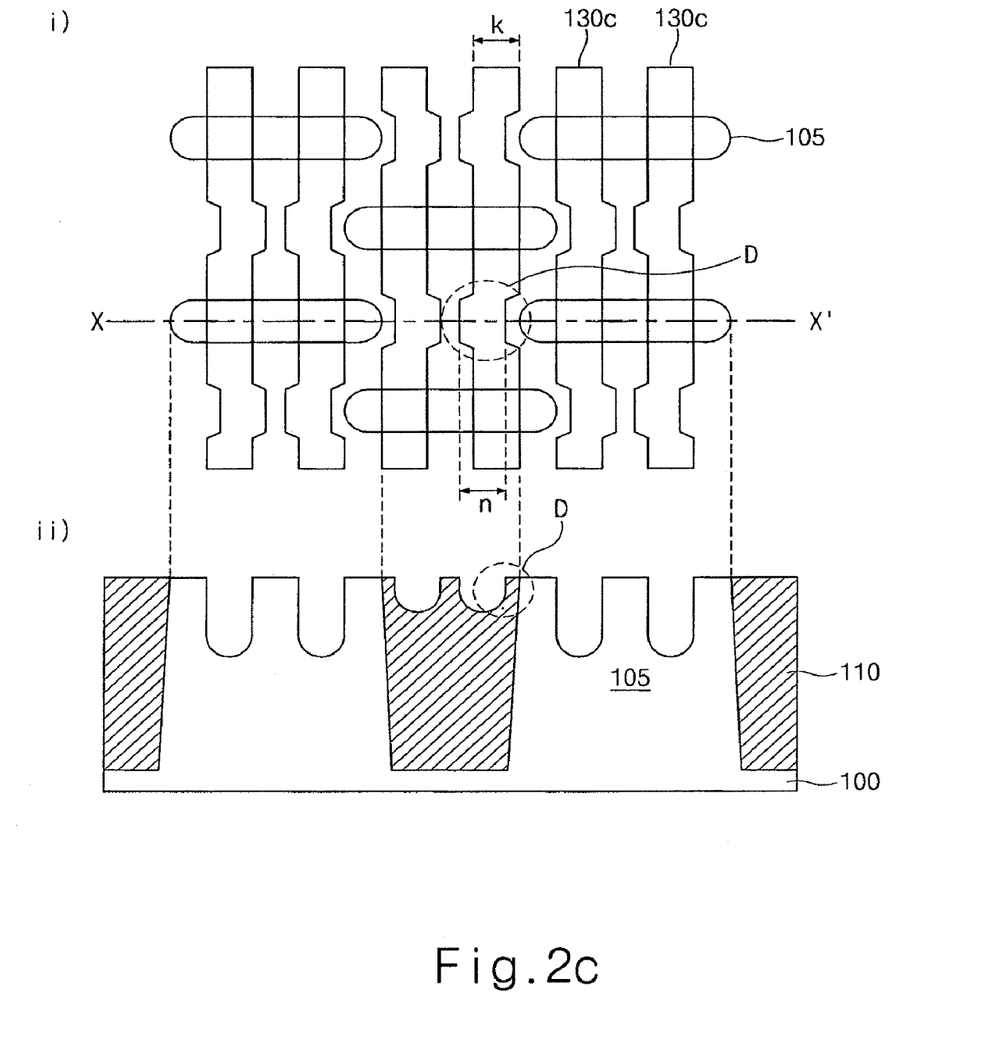

FIGS. 2a through 2c are diagrams illustrating an exposure mask and a method for manufacturing a semiconductor using the same according to an embodiment of the present invention.

When a lithography process is performed with the exposure mask, recess patterns 130a, 130b, 130c that define recess regions are formed perpendicular to an active region 105.

One active region 105 includes two recess patterns, and both sides of the edge of the active region 105 is adjacent to one recess pattern.

The recess pattern adjacent to both sides of the edge of the active region 105 is separated by a given distance from the edge of the active region 105 so that the recess pattern does not contact with the active region 105.

(i) of FIGS. 2a through 2c are plane diagrams, and (ii) of FIGS. 2a through 2c are cross-sectional diagrams taken along X-X'.

(ii) shows that a photoresist pattern (not shown) that defines a recess region is formed and a semiconductor substrate 100 is etched at a given depth with the photoresist pattern (not shown) as a mask. The recess pattern and the neighboring active region 105 are separated.

The recess pattern 130a having a portion adjacent to the edge of the active region 105 has one side formed to be concave which is separated by a given distance from the edge of the active region 105 as shown in 'B'. The recess pattern 130a having a line-width of 'k' has a line-width smaller than that of the region that is not adjacent to the active region 105 having a line-width of 'l'.

The recess pattern 130b having a portion adjacent to the edge of the active region 105 has one side formed to be concave which is separated by a given distance from the edge of the active region 150 as shown in 'C' and the other side to be concave which is separated toward the direction of the one side.

The recess pattern 130b having a line-width of 'k' has a line-width smaller than that of the region that is not adjacent to the edge of the active region 105 having a line-width of 'm'.

The recess pattern 130c having a portion adjacent to the edge of the active region 105 has one side formed to be convex which is separated at a given as shown in 'D' and the other side to be concave in the opposite direction of the one side.

The recess pattern 130c having a line width of 'k' has the same line width as that of the region which is not adjacent to the edge of the active region 105 having a line-width of 'n'.

FIGS. 3a through 3d are cross-sectional diagrams illustrating a method for manufacturing a semiconductor device using an exposure mask according to an embodiment of the present invention.

Figure 3A:
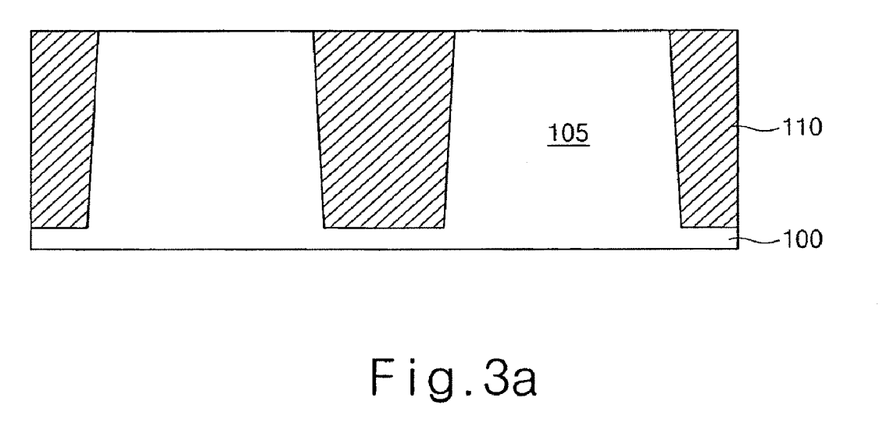
FIGS. 3a through 3d are cross-sectional diagrams illustrating a method for manufacturing a semiconductor device using an exposure mask according to an embodiment of the present invention.

A pad nitride film (not shown) is formed over the semiconductor substrate 100, and the pad nitride film (not shown) and the semiconductor substrate 100 having a given depth are etched to form a device isolation trench (not shown).

A sidewall oxide film (not shown) having a predetermined thickness and a liner nitride film (not shown) are formed over the exposed semiconductor substrate 100 in the device isolation trench (not shown).

A device isolation oxide film is formed to fill the device isolation trench (not shown). A planarizing process is performed until the semiconductor substrate 100 is exposed to obtain a device isolation region 110 that defines the active region 105.

A photoresist film (not shown) is formed over the semiconductor substrate 100 having the device isolation region 110. A lithography process is performed using an exposure mask for recess gate to form a photoresist pattern (not shown) that defines a recess region.

Figure 3B:
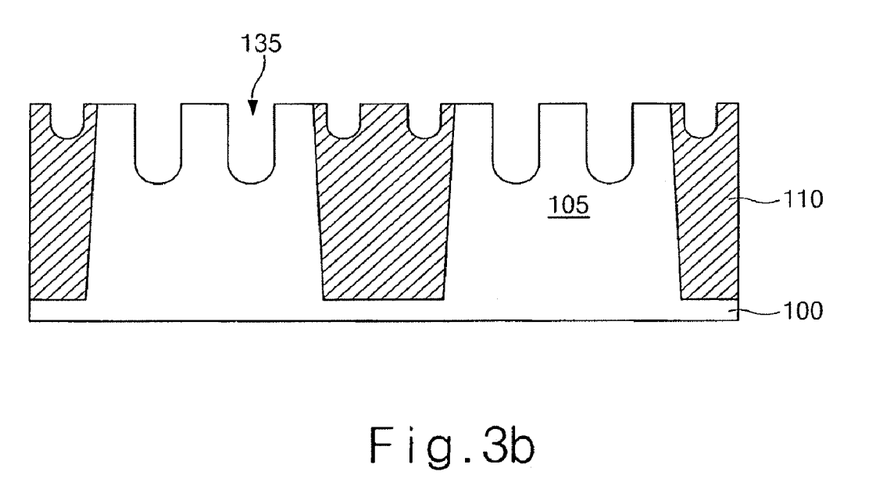

The semiconductor substrate 100 is etched with the photoresist pattern (not shown) as a mask to form a recess 135 which is a neck portion of a bulb-type recess.

When the recess 135 is formed using the exposure mask for recess gate of FIG. 2a, the recess 135 is separated by a given distance from the edge of the active region 105 to prevent damage of the semiconductor substrate 100 of the edge of the active region 105.

Figure 3C:
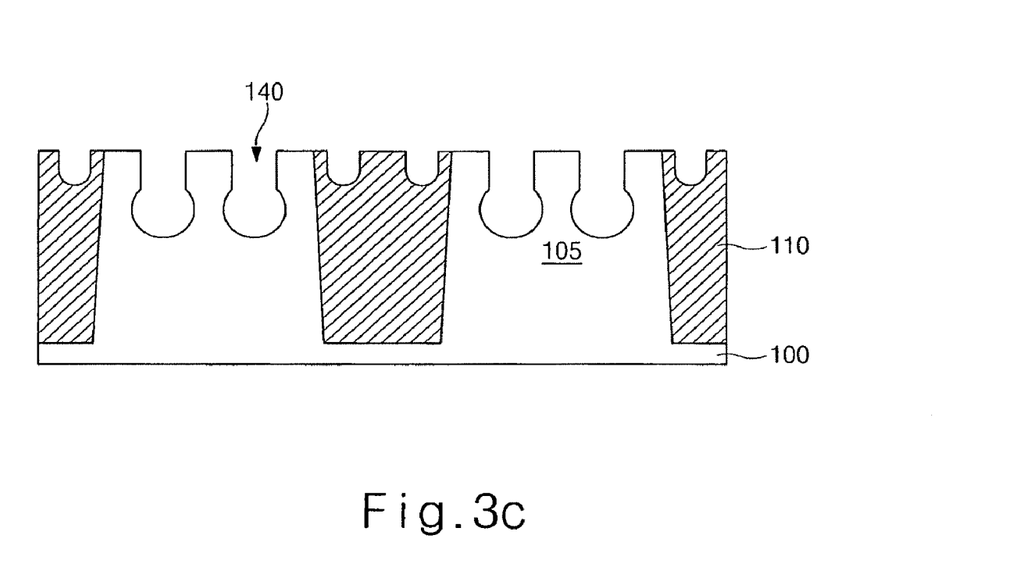

The recess 135 is further etched to form a bulb-type recess 140.

The bulb-type recess 140 is formed by an isotropic etching process. Due to the etching selectivity between the device isolation region 110 which is an oxide film and the semiconductor substrate 100 which is silicon, the recess over the device isolation region 110 is not etched but the recess over the active region 105 is further etched to obtain the bulb-type recess 140.

Figure 3D:
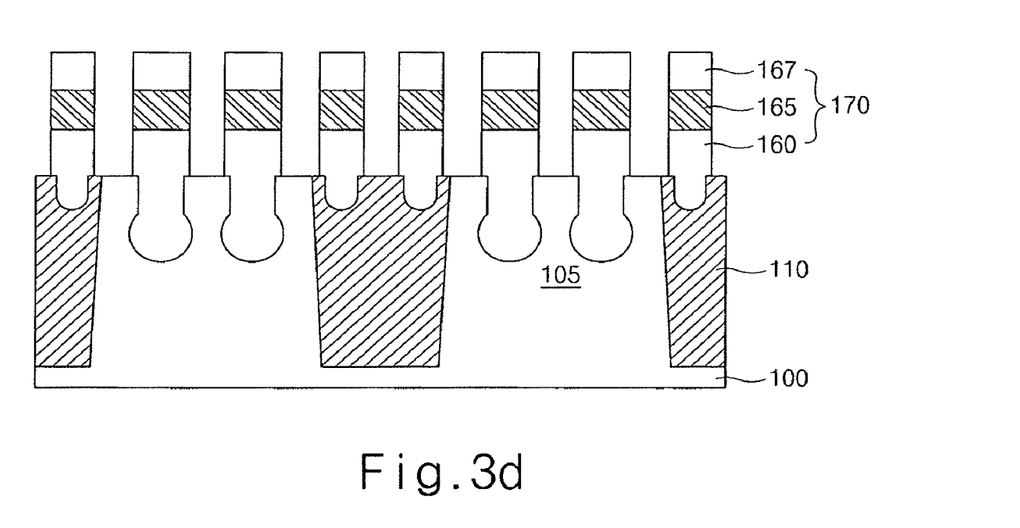

A gate oxide film (not shown) having a given thickness is formed over the semiconductor substrate 100 including the bulb-type recess 140. A deposition structure including a gate polysilicon layer 160, a gate metal layer 165 and a gate hard mask layer 167 is formed to fill the bulb-type recess 140.

The deposition structure is etched to form a gate pattern 170. A spacer (not shown) is formed at the sidewall of the gate pattern 170 to obtain a bulb-type recess gate.

The gate pattern 170 is formed using the exposure mask for recess gate used in formation of the recess.

Figure 4A:
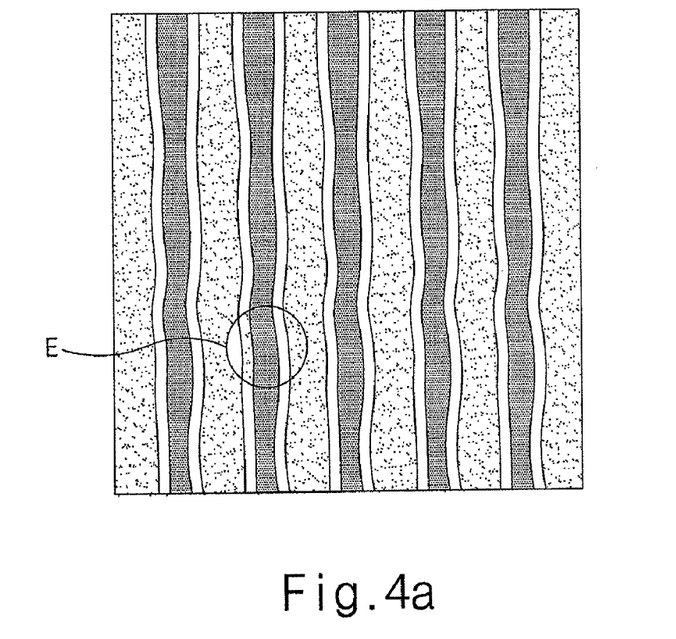
FIGS. 4a and 4b are photographs illustrating the effect of the method for manufacturing a semiconductor device according to an embodiment of the present invention.
Figure 4B:
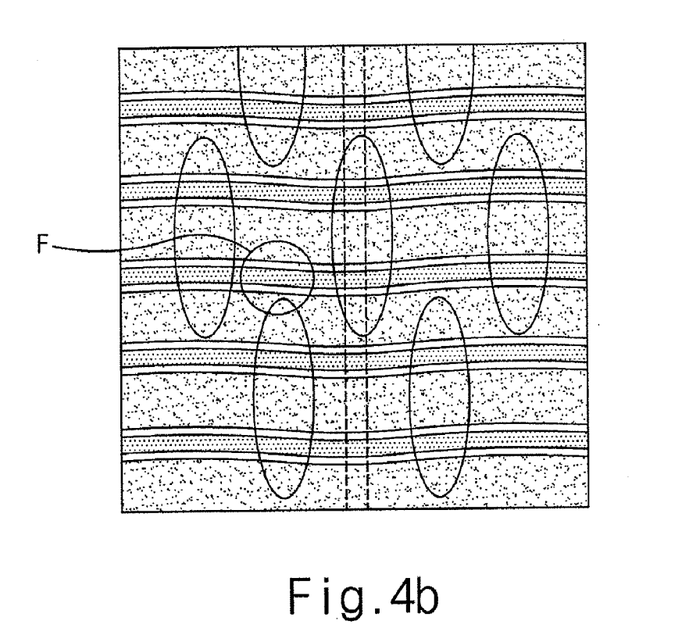

FIGS. 4a and 4b are photographs illustrating the effect of the method for manufacturing a semiconductor device according to an embodiment of the present invention.

FIG. 4a shows a photograph of the recess pattern of FIG. 2a. As shown in 'E', the recess pattern has one side formed to be concave which is separated by a given distance from the portion adjacent to the edge of the active region and the other side formed to be concave which is separated toward the direction of the one side.

FIG. 4b shows that the recess is formed with the recess pattern of FIG. 4a as a mask. As shown in 'F', the recess pattern does not contact with the edge of the active region to be separated at a given distance, thereby preventing damage of the semiconductor substrate.

As described above, in an exposure mask and a method for manufacturing a semiconductor device using the same according to an embodiment of the present invention, when a recess of a bulb-type recess gate is formed, the recess formed in a device isolation region is formed to be separated from an edge of an active region, thereby preventing damage of a semiconductor substrate of the edge of the active region and a defect during a Self Alignment Contact process to improve characteristics and yield of devices.

The above embodiments of the present invention are illustrative and not limitative. Various alternatives and equivalents are possible. The invention is not limited by the lithography steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:
1. An exposure mask comprising:
a plurality of active region patterns; and
a plurality of recess patterns with a first line width, passing across the active region patterns, wherein the line width of at least one of the plurality of recess patterns neigh- boring the edge of the plurality of active region patterns is narrowed down into a second line width.

2. The exposure mask according to claim 1, wherein the at least one of the plurality of recess patterns and the neighboring one of the plurality of active region patterns are separated.

3. The exposure mask according to claim 1, wherein the at least one of the plurality of recess patterns has a concave on the side which is neighboring the one of the plurality of active region patterns.

4. The exposure mask according to claim 1, wherein the at least one of the plurality of recess patterns has concaves both on the side which is neighboring the one of the plurality of active region patterns and on the opposite side thereof 5. An exposure mask for patterning a semiconductor substrate having a device isolation region that defines a first active region and a second active region, the exposure mask being configured to form a photoresist pattern used to form a recess in the first active region and a recess in the device isolation region, the photoresist pattern comprising a recess pattern having a first portion that passes across the first active region and a second portion that passes adjacent to an edge of the second active region, the first portion having a first line width that is larger than a second line width of the second portion.

6. The exposure mask according to claim 5, wherein the second portion includes a first side having a concave shape that is disposed adjacent to the second active region.

7. The exposure mask according to claim 6, wherein the second portion includes a second side having a concave shape that is disposed opposite to the first side.

8. The exposure mask according to claim 5, wherein the photoresist pattern further comprises a second recess pattern having a third portion that passes across the second active region and a fourth portion that passes adjacent to an edge of the first active region, the third portion having a third line width that is larger than a fourth line width of the fourth portion.

9. The exposure mask according to claim 8, wherein the fourth portion includes a third side having a concave shape that is disposed adjacent to the first active region.

10. The exposure mask according to claim 9, wherein the fourth portion includes a fourth side having a concave shape that is disposed opposite to the third side.

* * * * *